US010218335B2

(12) United States Patent
Matsuda et al.

(10) Patent No.: US 10,218,335 B2
(45) Date of Patent: Feb. 26, 2019

(54) DUPLEXER

(71) Applicant: TAIYO YUDEN CO., LTD., Tokyo (JP)

(72) Inventors: Takashi Matsuda, Tokyo (JP); Masumi Kida, Tokyo (JP); Taisei Irieda, Tokyo (JP); Tokihiro Nishihara, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 70 days.

(21) Appl. No.: 15/422,890

(22) Filed: Feb. 2, 2017

(65) Prior Publication Data

US 2017/0244387 A1  Aug. 24, 2017

(30) Foreign Application Priority Data

Feb. 23, 2016  (JP) ................. 2016-032472

(51) Int. Cl.
*H03H 9/72* (2006.01)
*H03H 9/70* (2006.01)
(Continued)

(52) U.S. Cl.
CPC .............. *H03H 9/725* (2013.01); *H03H 3/04* (2013.01); *H03H 3/10* (2013.01); *H03H 9/173* (2013.01);
(Continued)

(58) Field of Classification Search
CPC ............ H03H 3/04; H03H 3/10; H03H 9/173; H03H 9/64; H03H 9/70; H03H 9/725; H03H 2003/0407; H03H 9/706
(Continued)

(56) References Cited

U.S. PATENT DOCUMENTS 9,240,768 B2 * 1/2016 Nishihara .......... H03H 9/02102
2013/0127565 A1  5/2013 Nishihara et al.

FOREIGN PATENT DOCUMENTS

JP  2005-295496 A  10/2005
JP  2013-110655 A  6/2013

OTHER PUBLICATIONS

Japanese Office Action dated Apr. 24, 2018, in a counterpart Japanese patent application No. 2016-032472. (A machine translation (not reviewed for accuracy) attached.).

* cited by examiner

*Primary Examiner* — Robert J Pascal
*Assistant Examiner* — Jorge L Salazar, Jr.
(74) *Attorney, Agent, or Firm* — Chen Yoshimura LLP

(57) ABSTRACT

A duplexer includes: a first filter connected between a common terminal and a first terminal and including first series and first parallel resonators; a second filter having a passband higher than that of the first filter, connected between the common terminal and a second terminal, and including second series and second parallel resonators; a first chip including the first series and second parallel resonators mounted thereon; a second chip including the first parallel and second series resonators mounted thereon, wherein when GA and HGB represent temperature coefficients of antiresonant frequencies of the first and second series resonators, and HGA and GB represent temperature coefficients of resonant frequencies of the first and second parallel resonators, a magnitude relationship among GA, GB, HGA, and HGB is none of a relationship in which GA (GB) differs from HGA (HGB), and GB (GA) and HGB (HGA) are located between GA (GB) and HGA (HGB).

12 Claims, 14 Drawing Sheets

(51) Int. Cl.
*H03H 3/04* (2006.01)
*H03H 3/10* (2006.01)
*H03H 9/17* (2006.01)

(52) U.S. Cl.
CPC .............. *H03H 9/70* (2013.01); *H03H 9/706* (2013.01); *H03H 2003/0407* (2013.01)

(58) Field of Classification Search
USPC ........................ 333/133, 187, 188, 193–196
See application file for complete search history.

FIG. 11A

|  | SAW P1-P3 fr HGA | FBAR S1-S4 fa GA | FBAR P4-P6 fr GB | SAW S5-S8 fa HGB |
|---|---|---|---|---|
| PATTERN 0 | −27 ppm/°C | −27 ppm/°C | −32 ppm/°C | −32 ppm/°C |
| PATTERN 1 | −30 ppm/°C | −27 ppm/°C | −32 ppm/°C | −20 ppm/°C |
| PATTERN 2 | −25 ppm/°C | −27 ppm/°C | −32 ppm/°C | −15 ppm/°C |
| PATTERN 3 | −40 ppm/°C | −27 ppm/°C | −32 ppm/°C | −30 ppm/°C |
| PATTERN 4 | −44 ppm/°C | −27 ppm/°C | −32 ppm/°C | −34 ppm/°C |
| PATTERN 5 | −30 ppm/°C | −27 ppm/°C | −32 ppm/°C | −29 ppm/°C |
| PATTERN 6 | −34 ppm/°C | −27 ppm/°C | −32 ppm/°C | −24 ppm/°C |

FIG. 11B

|  | FILM THICKNESS OF TEMPERATURE COMPENSATION FILM 82 (SILICON OXIDE FILM) | |
|---|---|---|
|  | PARALLEL RESONATOR P1-P3 | SERIES RESONATOR S5-S8 |
| PATTERN 0 | 424 nm | 485 nm |
| PATTERN 1 | 399 nm | 570 nm |
| PATTERN 2 | 440 nm | 606 nm |
| PATTERN 3 | 318 nm | 499 nm |
| PATTERN 4 | 286 nm | 470 nm |
| PATTERN 5 | 399 nm | 506 nm |
| PATTERN 6 | 367 nm | 542 nm |

FIG. 12A

|  | TRANSMIT FILTER | | RECEIVE FILTER | |
| --- | --- | --- | --- | --- |
|  | S11[dB] | S22[dB] | S11[dB] | S33[dB] |
| PATTERN 0 | -11.244 | -11.555 | -10.928 | -9.73 |
| PATTERN 1 | -11.341 | -11.678 | -10.885 | -11.052 |
| PATTERN 2 | -11.345 | -11.608 | (-10.866) | -10.751 |
| PATTERN 3 | -10.904 | -11.24 | -10.929 | -10.751 |
| PATTERN 4 | (-10.567) | (-10.88) | -10.936 | (-9.535) |
| PATTERN 5 | -11.281 | -11.628 | -10.92 | -10.043 |
| PATTERN 6 | -11.333 | -11.728 | -10.902 | -10.596 |

FIG. 12B

|  | TRANSMIT FILTER | | RECEIVE FILTER | |
| --- | --- | --- | --- | --- |
|  | S11[%] | S22[%] | S11[%] | S33[%] |
| PATTERN 0 | -0.890 | -1.475 | -0.073 | -11.962 |
| PATTERN 1 | -0.035 | -0.426 | -0.466 | -0.000 |
| PATTERN 2 | 0.000 | -1.023 | (-0.640) | -2.723 |
| PATTERN 3 | -3.887 | -4.161 | -0.064 | -10.052 |
| PATTERN 4 | (-6.858) | (-7.231) | -0.000 | (-13.726) |
| PATTERN 5 | -0.564 | -0.853 | -0.146 | -9.130 |
| PATTERN 6 | -0.106 | -0.000 | -0.311 | -4.126 |

FIG. 14

| LTE BAND | TRANSMIT BAND [MHz] | RECEIVE BAND [MHz] |
|---|---|---|
| B1 | 1920~1980 | 2110~2170 |
| B2 | 1850~1910 | 1930~1990 |
| B3 | 1710~1785 | 1805~1880 |
| B4 | 1710~1755 | 2110~2155 |
| B5 | 824~849 | 869~894 |
| B7 | 2500~2570 | 2620~2690 |
| B8 | 880~915 | 925~960 |
| B12 | 699~716 | 729~746 |
| B13 | 777~787 | 746~756 |
| B17 | 704~716 | 734~746 |
| B20 | 832~862 | 791~821 |
| B22 | 3410~3490 | 3510~3590 |
| B25 | 1850~1915 | 1930~1995 |
| B26 | 814~849 | 859~894 |
| B27 | 807~824 | 852~869 |
| B28 | 703~748 | 758~803 |

DUPLEXER

CROSS-REFERENCE TO RELATED APPLICATION

This application is based upon and claims the benefit of priority of the prior Japanese Patent Application No. 2016-032472, filed on Feb. 23, 2016, the entire contents of which are incorporated herein by reference.

FIELD

A certain aspect of the present invention relates to a duplexer.

BACKGROUND

As duplexers for high-frequency circuits of wireless terminals such as mobile phones, filters using Surface Acoustic Wave (SAW) resonators or piezoelectric thin film resonators have been widely used. The duplexer includes a plurality of filters such as a transmit filter and a receive filter. As filters such as a transmit filter and a receive filter, used are ladder-type filters including a series resonator and a parallel resonator.

Japanese Patent Application Publication No. 2013-110655 (Patent Document 1) describes that a chip on which resonators that affect the guard-band side skirt characteristic of the passband of the filter are formed is separated from a chip on which resonators that affect the skirt characteristic at the opposite end of the passband from the guard band are formed. The chips are formed by different element technologies. Japanese Patent Application Publication No. 2005-295496 describes that the electromechanical coupling coefficient of a series resonator is made to differ from that of a parallel resonator.

The technique disclosed in Patent Document 1 can make the guard-band side skirt characteristic steeper and improve the temperature stability and widen the band of the filter. To improve the temperature stability, the absolute values of the Temperature Coefficient of Frequency (TCFs) of the resonant frequency and the antiresonant frequency of the resonator are preferably brought close to zero. However, it is difficult to bring the absolute values of the temperature coefficients of the resonant frequencies and the antiresonant frequencies of all resonators close to zero. Thus, a temperature change may deteriorate the reflection characteristic of the filter.

SUMMARY OF THE INVENTION

According to a first aspect of the present invention, there is provided a duplexer including: a first filter that is connected between a common terminal and a first terminal, and includes a first series resonator and a first parallel resonator; a second filter that has a passband higher than a passband of the first filter, is connected between the common terminal and a second terminal, and includes a second series resonator and a second parallel resonator; a first chip on which the first series resonator and the second parallel resonator are located; a second chip that differs from the first chip, and on which the first parallel resonator and the second series resonator are located, wherein when a temperature coefficient of an antiresonant frequency of the first series resonator is represented by GA, a temperature coefficient of a resonant frequency of the first parallel resonator is represented by HGA, a temperature coefficient of an antiresonant frequency of the second series resonator is represented by HGB, and a temperature coefficient of a resonant frequency of the second parallel resonator is represented by GB, a magnitude relationship among GA, GB, HGA, and HGB is none of a relationship in which GA differs from HGA, and GB and HGB are located between GA and HGA, and a relationship in which GB differs from HGB, and GA and HGA are located between GB and HGB.

According to a second aspect of the present invention, there is provided a duplexer including: a first filter that is located between a common terminal and a first terminal, and includes a first series resonator and a first parallel resonator; a second filter that has a passband higher than a passband of the first filter, is connected between the common terminal and a second terminal, and includes a second series resonator and a second parallel resonator; a first chip on which the first series resonator and the second parallel resonator are located; and a second chip that differs from the first chip, and on which the first parallel resonator and the second series resonator are located, wherein when a temperature coefficient of an antiresonant frequency of the first series resonator is represented by GA, a temperature coefficient of a resonant frequency of the first parallel resonator is represented by HGA, a temperature coefficient of an antiresonant frequency of the second series resonator is represented by HGB, and a temperature coefficient of a resonant frequency of the second parallel resonator is represented by GB, GA is practically identical to HGA, GB is practically identical to HGB, GA differs from HGA, and GB differs from HGB.

BRIEF DESCRIPTION OF THE DRAWINGS

FIG. 11A lists HGA, GB, GA, and HGB in each pattern, and FIG. 11B lists the film thickness of a temperature compensation film of a surface acoustic wave resonator in each pattern;

FIG. 12A lists the worst values of the reflection characteristics of a transmit filter and a receive filter, and FIG. 12B lists the rates of changes of the reflection characteristics of the transmit filter and the receive filter;

FIG. 14 lists examples of an LTE band to which the first embodiment can be applied.

DETAILED DESCRIPTION

Hereinafter, embodiments of the present invention will be described with reference to the accompanying drawings.

First Embodiment

Figure 1:
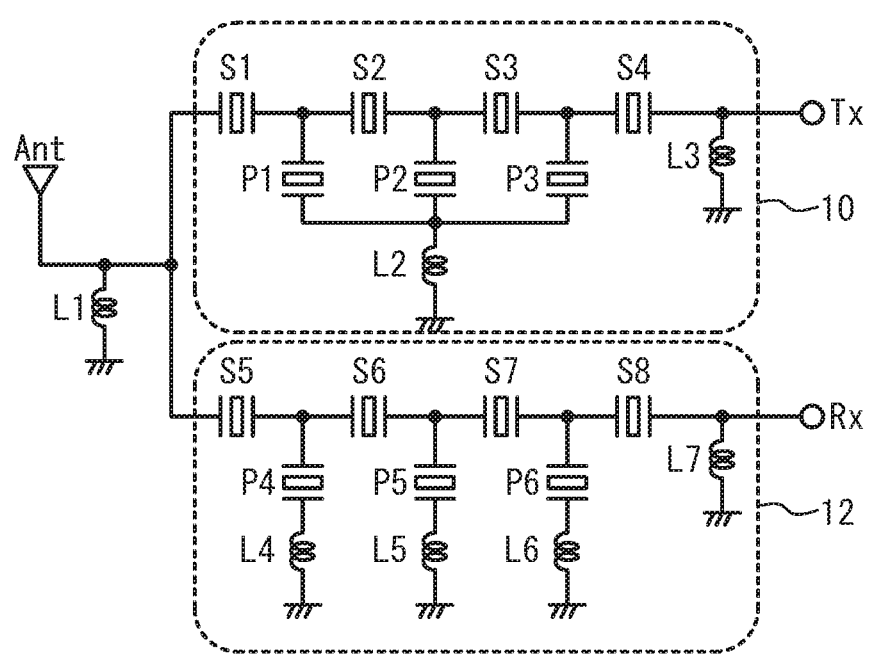
FIG. 1 is a circuit diagram of a duplexer in accordance with a first embodiment.

FIG. 1 is a circuit diagram of a duplexer in accordance with a first embodiment. As illustrated in FIG. 1, a transmit filter 10 is electrically connected between a common terminal Ant and a transmit terminal Tx. A receive filter 12 is electrically connected between the common terminal Ant and a receive terminal Rx. An inductor L1 is electrically connected between the common terminal Ant and a ground. The passband of the receive filter 12 is higher than the passband of the transmit filter 10. The transmit filter 10 outputs signals in the transmit band to the common terminal Ant among high-frequency signals input to the transmit terminal Tx, and suppresses signals with other frequencies. The receive filter 12 outputs signals in the receive band to the receive terminal Rx among high-frequency signals input to the common terminal Ant, and suppresses signals with other frequencies. The inductor L1 functions as a matching circuit.

The transmit filter 10 is a ladder-type filter, and includes series resonators S1 through S4, parallel resonators P1 through P3, and inductors L2 and L3. The series resonators S1 through S4 are connected in series between the common terminal Ant and the transmit terminal Tx. The parallel resonators P1 through P3 are connected in parallel between the common terminal Ant and the transmit terminal Tx. The inductor L2 is commonly connected between the parallel resonators P1 through P3 and a ground. The inductor L3 is connected between the transmit terminal Tx and a ground. The inductor L2 is an inductor for forming an attenuation pole in the receive band. The inductor L3 is an inductor for impedance matching of the transmit terminal Tx.

The receive filter 12 is a ladder-type filter, and includes series resonators S5 through S8, parallel resonators P4 through P6, and inductors L4 through L7. The series resonators S5 through S8 are connected in series between the common terminal Ant and the receive terminal Rx. The parallel resonators P4 through P6 are connected in parallel between the common terminal Ant and the receive terminal Rx. The inductors L4 through L6 are connected between the parallel resonators P4 through P6 and a ground, respectively. The inductor L7 is connected between the receive terminal Rx and a ground. The inductors L4 through L6 are inductors for forming an attenuation pole in the transmit band. The inductor L7 is an inductor for impedance matching of the receive terminal Rx.

Figure 2:
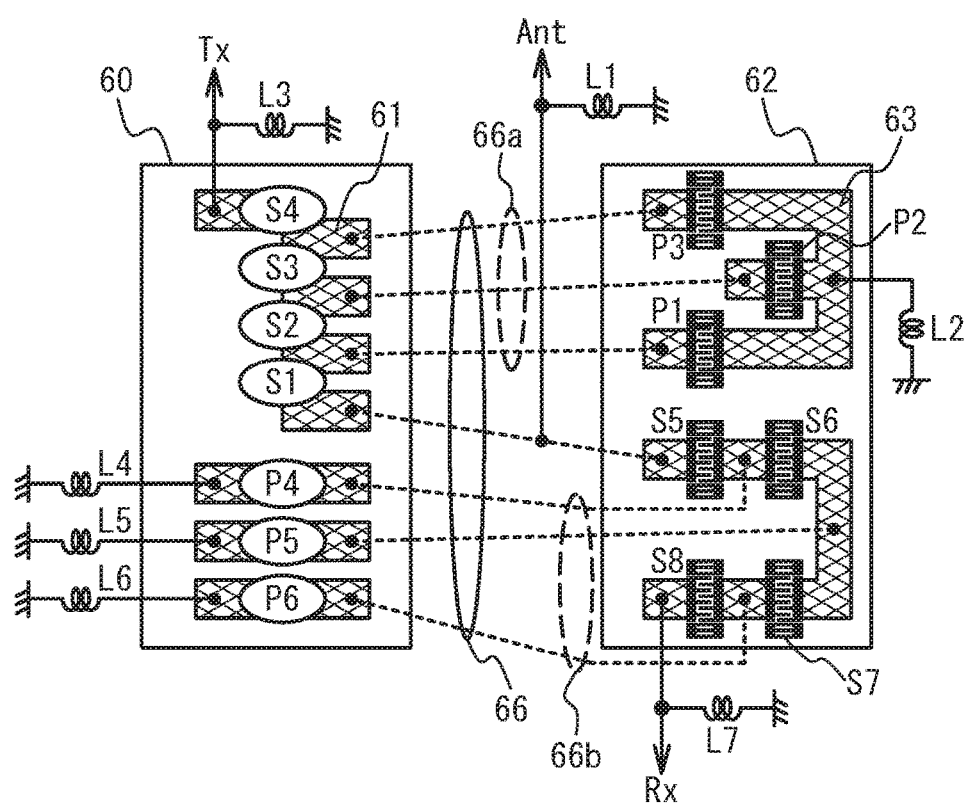
FIG. 2 is a schematic plan view of the duplexer in accordance with the first embodiment.

FIG. 2 is a schematic plan view of the duplexer in accordance with the first embodiment. As illustrated in FIG. 2, the series resonators S1 through S4 and the parallel resonators P4 through P6 are piezoelectric thin film resonators, and formed on a chip 60. Wiring lines 61 formed on the chip 60 are connected to the series resonators S1 through S4 and the parallel resonators P4 through P6. The series resonators S5 through S8 and the parallel resonators P1 through P3 are surface acoustic wave resonators, and formed on a chip 62. Wiring lines 63 formed on the chip 62 are connected to the series resonators S5 through S8 and the parallel resonators P1 through P3.

Figure 3:
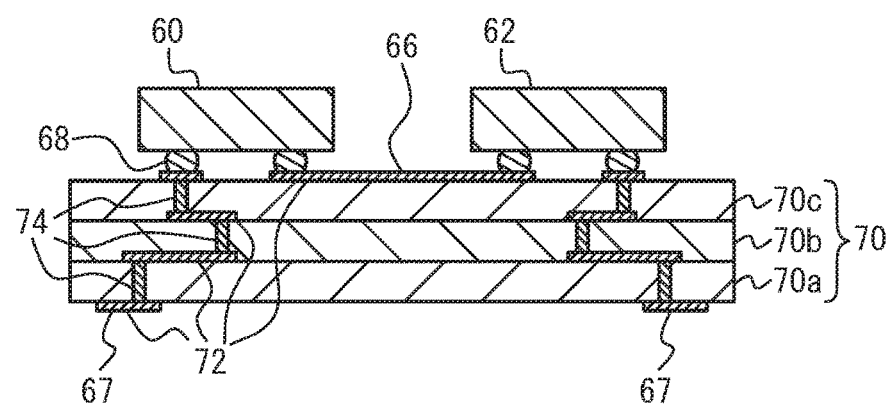
FIG. 3 is a schematic cross-sectional view of the duplexer in accordance with the first embodiment.

FIG. 3 is a schematic cross-sectional view of the duplexer in accordance with the first embodiment. As illustrated in FIG. 3, a substrate 70 includes insulating layers 70a through 70c that are stacked. Metal layers 72 are formed on the upper surfaces and the lower surfaces of the insulating layers 70a through 70c. Foot pads 67 are formed of the metal layer 72 on the lower surface of the insulating layer 70a. A wiring line 66 is formed of the metal layer 72 on the upper surface of the insulating layer 70c. The chips 60 and 62 are flip-chip mounted on the substrate 70 through bumps 68. The insulating layers 70a through 70c are, for example, resin layers or ceramic layers. The metal layer 72 is, for example, a copper layer or a gold layer. The bump 68 is, for example, a solder bump or a gold bump.

As illustrated in FIG. 2 and FIG. 3, the series resonators S1 through S4 and the parallel resonators P1 through P3 are electrically connected through wiring lines 66a, the bumps 68, and the wiring lines 63 respectively included in the wiring lines 61, the bumps 68, and the wiring lines 66. The parallel resonators P4 through P6 and the series resonators S5 through S8 are electrically connected through wiring lines 66b, the bumps 68, and the wiring lines 63 respectively included in the wiring lines 61, the bumps 68, and the wiring lines 66. The inductors L1 through L7 are formed of the metal layer 72. The common terminal Ant, the transmit terminal Tx, and the receive terminal Rx correspond to the foot pads 67.

Figure 4A:
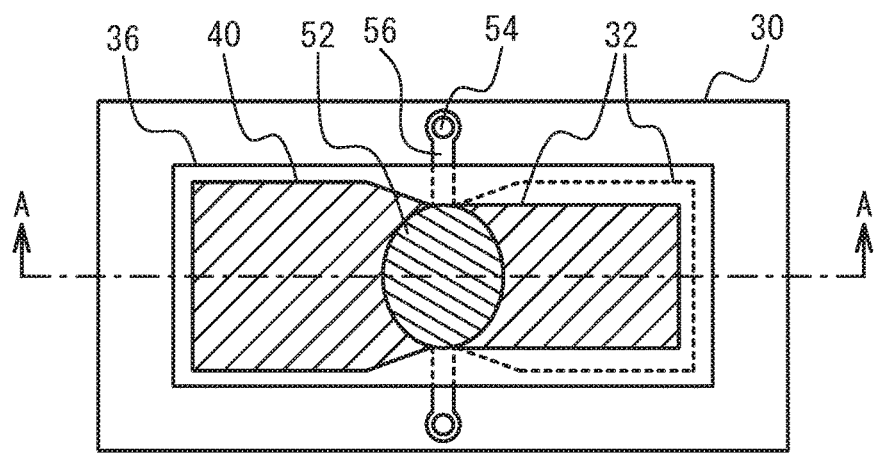
FIG. 4A is a plan view of an exemplary piezoelectric thin film resonator in the first embodiment.
Figure 4B:
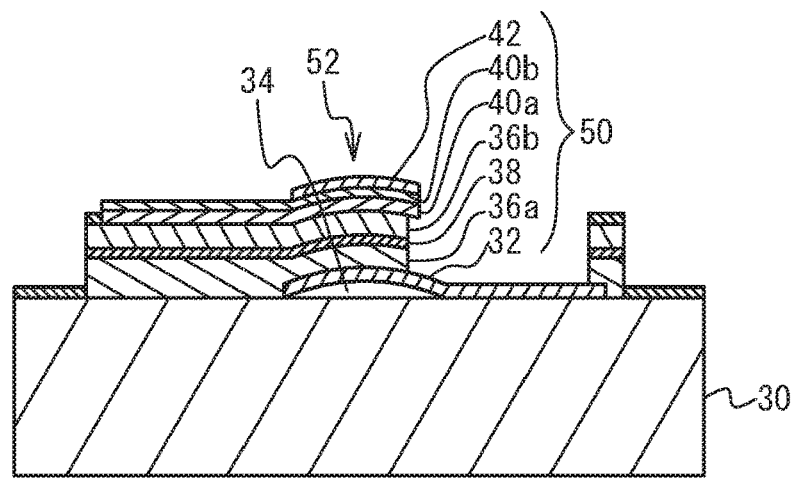
FIG. 4B is a cross-sectional view taken along line A-A in FIG. 4A in a series resonator.
Figure 4C:
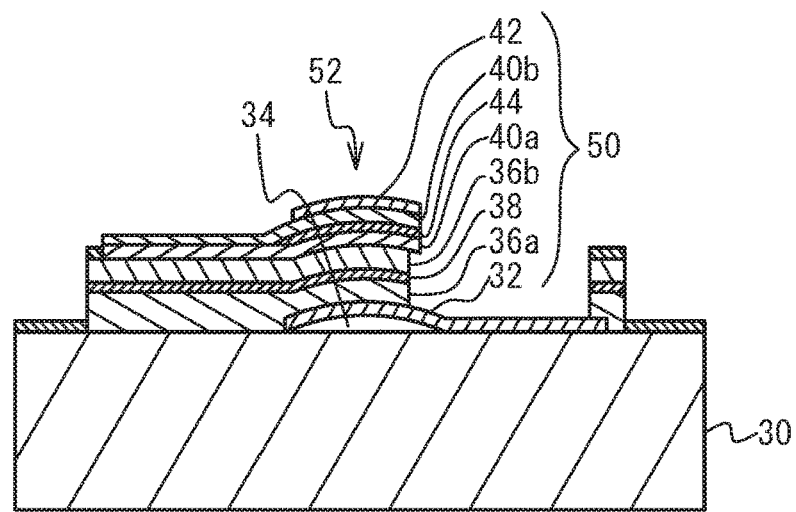
FIG. 4C is a cross-sectional view taken along line A-A in FIG. 4A in a parallel resonator.

The piezoelectric thin film resonator that is used for the series resonators S1 through S4 and the parallel resonators P4 through P6 will be described. FIG. 4A is a plan view of a piezoelectric thin film resonator in the first embodiment, FIG. 4B is a cross-sectional view taken along line A-A in FIG. 4A in the series resonator, and FIG. 4C is a cross-sectional view taken along line A-A in FIG. 4A in the parallel resonator. This piezoelectric thin film resonator is a Film Bulk Acoustic Resonator (FBAR) using a Bulk Acoustic Wave (BAW).

With reference to FIG. 4A and FIG. 4B, the structure of the series resonator will be described. A lower electrode 32 is located on a substrate 30. An air gap 34 having a dome-shaped bulge is formed between the flat principal surface of the substrate 30 and the lower electrode 32. A piezoelectric film 36 is located on the lower electrode 32. The piezoelectric film 36 includes a lower piezoelectric film 36a and an upper piezoelectric film 36b. A temperature compensation film 38 is located between the lower and upper piezoelectric films 36a and 36b.

An upper electrode 40 is located on the piezoelectric film 36 so as to have a region (a resonance region 52) in which the upper electrode 40 faces the lower electrode across the piezoelectric film 36. The resonance region 52 has an elliptical shape, and is a region in which the acoustic wave in the thickness extension mode resonates. The upper electrode 40 includes a lower layer 40a and an upper layer 40b. A frequency adjusting film 42 is formed on the upper electrode 40. A multilayered film 50 within the resonance region 52 includes the lower electrode 32, the piezoelectric film 36, the temperature compensation film 38, the upper electrode 40, and the frequency adjusting film 42. The frequency adjusting film 42 may act as a passivation film.

As illustrated in FIG. 4A, an introduction path 56 for etching a sacrifice layer is formed in the lower electrode 32. The sacrifice layer is a layer for forming the air gap 34. The vicinity of the tip of the introduction path 56 is not covered with the piezoelectric film 36, and the lower electrode 32 has a hole portion 54 at the end of the introduction path 56.

With reference to FIG. 4C, the structure of the parallel resonator will be described. The parallel resonator differs from the series resonator in that a mass load film 44 is located between the lower and upper layers 40a and 40b of the upper electrode 40. Thus, the multilayered film 50 includes the mass load film 44 formed across the entire surface within the resonance region 52 in addition to the multilayered film of the series resonator. Other structures are the same as those of the series resonator illustrated in FIG. 4B, and the description thereof is thus omitted.

The difference in resonant frequency between the series resonator and the parallel resonator is adjusted with the film thickness of the mass load film 44. The resonant frequency of each of the series resonator and the parallel resonator is adjusted by adjusting the film thickness of the corresponding frequency adjusting film 42.

The substrate 30 is, for example, a silicon (Si) substrate. The substrate 30 may be a quartz substrate, a glass substrate, a ceramic substrate, or a GaAs substrate instead of a Si substrate. The lower electrode 32 is formed of, for example, a multilayered film including a chrome (Cr) film at the substrate 30 side and a ruthenium (Ru) film at the piezoelectric film 36 side. The lower layer 40a and the upper layer 40b of the upper electrode 40 are respectively formed of, for example, a Ru film and a Cr film. The lower electrode 32 and the upper electrode 40 may be formed of a single-layer film of aluminum (Al), titanium (Ti), copper (Cu), molybdenum (Mo), tungsten (W), tantalum (Ta), platinum (Pt), rhodium (Rh), or iridium (Ir), or a multilayered film of at least two of them instead of Ru and Cr.

The piezoelectric film 36 is formed of, for example, an aluminum nitride (AlN) film having the main axis in the (002) direction. The piezoelectric film 36 may be made of zinc oxide (ZnO), lead zirconate titanate (PZT), or lead titanate (PbTiO$_3$) instead of aluminum nitride. Alternatively, for example, the piezoelectric film 36 may be mainly composed of aluminum nitride, and contain other elements for improving resonance characteristics or for improving piezoelectricity. For example, the use of scandium (Sc), a divalent element and a quadrivalent element, or a divalent element and a pentavalent element as additive elements improves the piezoelectricity of the piezoelectric film 36. Thus, the effective electromechanical coupling coefficient of the piezoelectric thin film resonator can be improved. The divalent element is, for example, calcium (Ca), magnesium (Mg), strontium (Sr), and zinc (Zn). The quadrivalent element is, for example, Ti, zirconium (Zr), or hafnium (Hf). The pentavalent element is, for example, Ta, niobium (Nb), or vanadium (V). Furthermore, the piezoelectric film 36 may be mainly composed of aluminum nitride and contain boron (B).

The frequency adjusting film 42 is formed of, for example, a silicon oxide (SiO$_2$) film. Instead of a silicon oxide film, a silicon nitride film or an aluminum nitride may be used. The mass load film 44 is formed of, for example, a Ti film. The mass load film 44 may be formed of a single-layer film of Ru, Cr, Al, Cu, Mo, W, Ta, Pt, Rh, or Ir instead of Ti. The mass load film 44 may be formed under the lower electrode 32, between the layers of the lower electrode 32, on the upper electrode 40, between the lower electrode 32 and the piezoelectric film 36, or between the piezoelectric film 36 and the upper electrode 40 instead of between the layers of the upper electrode 40 (between the lower layer 40a and the upper layer 40b).

The temperature compensation film 38 is a film having a temperature coefficient of an elastic constant opposite in sign to the temperature coefficient of the elastic constant of the piezoelectric film 36, and is formed of, for example, a silicon oxide film. The temperature compensation film 38 may be formed of a silicon nitride film. A ternary element may be added to the temperature compensation film 38 as long as the temperature compensation film 38 has a temperature compensation effect in the piezoelectric thin film resonator. The temperature compensation film 38 may be formed on the upper electrode 40, between the layers of the upper electrode 40, between the layers of the lower electrode 32, or under the lower electrode 32. To further produce the temperature compensation effect, the temperature compensation film 38 is preferably formed between the upper electrode 40 and the piezoelectric film 36, between the layers of the piezoelectric film 36, or between the piezoelectric film 36 and the lower electrode 32.

Figure 5A:
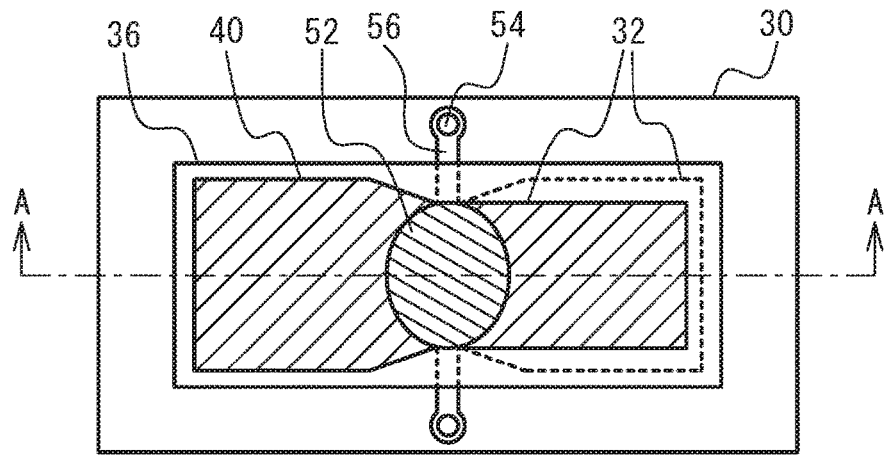
FIG. 5A is a plan view of another exemplary piezoelectric thin film resonator in the first embodiment.
Figure 5B:
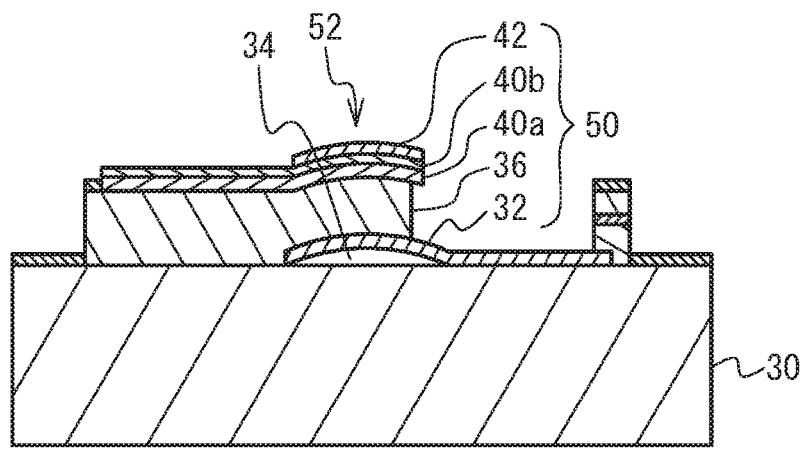
FIG. 5B is a cross-sectional view taken along line A-A in FIG. 5A in a series resonator.
Figure 5C:
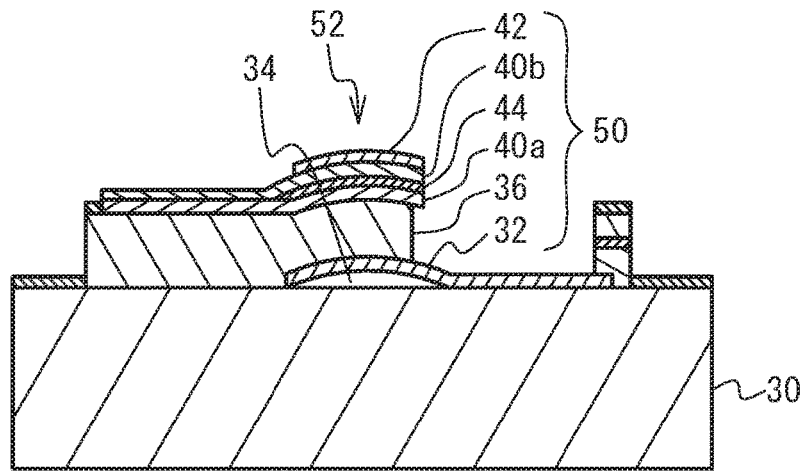
FIG. 5C is a cross-sectional view taken along line A-A in FIG. 5A in a parallel resonator.

FIG. 5A is a plan view of another exemplary piezoelectric thin film resonator in accordance with the first embodiment, FIG. 5B is a cross-sectional view taken along line A-A in FIG. 5A in the series resonator, and FIG. 5C is a cross-sectional view taken along line A-A in FIG. 5A in the parallel resonator. As illustrated in FIG. 5A through FIG. 5C, the piezoelectric thin film resonator does not include the temperature compensation film 38. Other structures are the same as those of FIG. 4A through FIG. 4C, and thus the description thereof is omitted.

As an example of the piezoelectric thin film resonator, an FBAR that includes the air gap 34 under the lower electrode 32 in the resonance region 52 has been described. The piezoelectric thin film resonator may be a Solidly Mounted Resonator (SMR) that includes an acoustic mirror configured to reflect an acoustic wave propagating through the piezoelectric film 36 instead of the air gap 34. An exemplary case where the resonance region 52 has an elliptical shape has been described, but the resonance region 52 may have a polygonal shape.

Figure 6A:
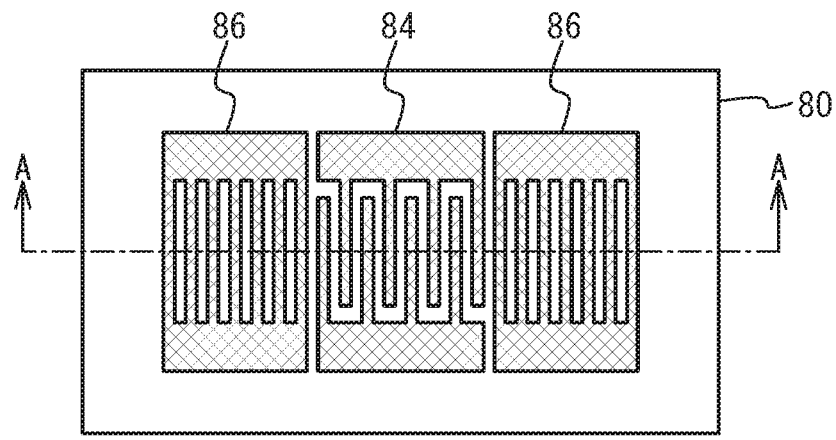
FIG. 6A is a plan view of an exemplary surface acoustic wave resonator in the first embodiment.

A description will now be given of a surface acoustic wave resonator used for the parallel resonators P1 through P3 and the series resonators S5 through S8. FIG. 6A is a plan view of an exemplary surface acoustic wave resonator in the first embodiment, and FIG. 6B through FIG. 6D are cross-sectional views taken along line A-A in FIG. 6A.

As illustrated in FIG. 6A through FIG. 6D, an Interdigital Transducer (IDT) 84 and reflectors 86 are formed on a piezoelectric substrate 80. The IDT 84 and the reflectors 86 are formed of a metal film 85. The IDT 84 includes a pair of comb-shaped electrodes facing each other. The comb-shaped electrode includes electrode fingers and a bus bar to which the electrode fingers are connected. The reflectors 86 are formed at the both sides of the IDT 84 in the propagation direction of the acoustic wave. The piezoelectric substrate 80 is, for example, a lithium tantalate substrate or a lithium niobate substrate. The metal film 85 is formed of, for example, an Al film or a Cu film.

Figure 6B:
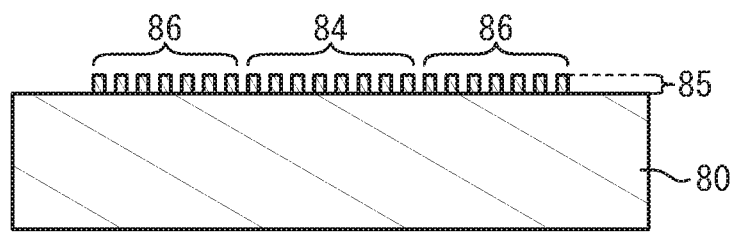
FIG. 6B through FIG. 6D are cross-sectional views taken along line A-A in FIG. 6A.
Figure 6C:
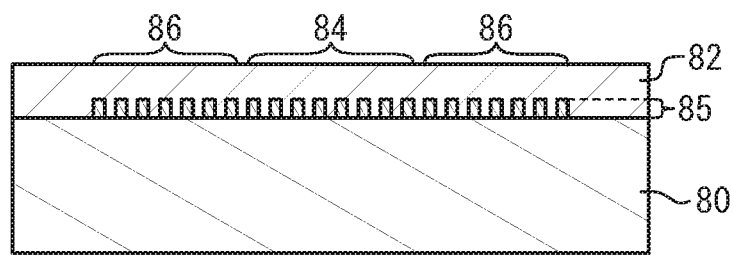
Figure 6D:
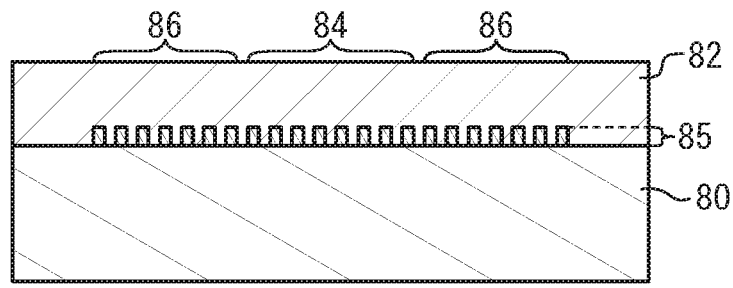

As illustrated in FIG. 6C and FIG. 6D, a temperature compensation film 82 is formed on the piezoelectric substrate 80 so as to cover the metal film 85. The temperature compensation film 82 is a film having a temperature coefficient of an elastic constant opposite in sign to the temperature coefficient of the elastic constant of the piezoelectric substrate 80, and is formed of, for example, a silicon oxide film. The temperature compensation film 82 may be formed of a silicon nitride film. A ternary element may be added to the temperature compensation film 82 as long as a temperature compensation effect is produced in the surface acoustic wave resonator. The temperature coefficient TCF can be changed by changing the film thicknesses of the temperature compensation film 82 as illustrated in FIG. 6C and FIG. 6D. The temperature compensation film 82 may be located between the piezoelectric substrate 80 and the metal film 85.

As illustrated in FIG. 6B, the surface acoustic wave resonator may not necessarily include the temperature compensation film 82. As illustrated in FIG. 6C and FIG. 6D, the temperature compensation film 82 may be provided. A Rayleigh wave or a Love wave may be used as a surface acoustic wave mainly used in the surface acoustic wave resonator.

A simulation was conducted on a duplexer for a Long Term Evolution (LTE) band B25. The LTE band is a frequency band supporting a LTE standard (E-UTRA Operating Band). The LTE band B25 has a transmit band of 1850 MHz to 1915 MHz and a receive band of 1930 MHz to 1995 MHz.

The materials and the film thicknesses of the piezoelectric thin film resonator used for the simulation are as follows. A temperature compensation film is not provided.
Lower electrode 32: Cr film with a film thickness of 85 nm and Ru film with a film thickness of 195 nm
Piezoelectric film 36: Aluminum nitride film with a film thickness of 1220 nm having the main axis in the (002) orientation
Lower layer 40a of the upper electrode 40: Ru film with a film thickness of 195 nm
Upper layer 40b of the upper electrode 40: Cr film with a film thickness of 25 nm
Frequency adjusting film 42: Silicon oxide film with a film thickness of 20 nm
Mass load film 44: Ti film with a film thickness of 40 nm The conditions of the surface acoustic wave resonator for the simulation are as follows.
Parallel Resonators P1 Through P3:
  Piezoelectric substrate 80: 128° rotated Y-cut X-propagation lithium niobate substrate
  Metal film 85: Cu film with a film thickness of 137 nm
  Temperature compensation film 82: Silicon oxide film with a film thickness of 566 nm
   (The film thickness is a thickness from the upper surface of the piezoelectric substrate 80, and the film thickness from the upper surface of the metal film 85 is 566 nm-137 nm=429 nm.)
  Pitch λ of the IDT 84: 1.8566 μm
  Number of pairs of the IDT 84: 50 pairs to 200 pairs
  Aperture length of the IDT 84: 15λ, to 35λ,
   (The combination of the number of pairs and the aperture length differs among the resonators P1 through P3.)
Series resonators S5 through S7:
  Piezoelectric substrate 80: 128° rotated Y-cut X-propagation lithium niobate substrate
  Metal film 85: Cu film with a film thickness of 132 nm
  Temperature compensation film 82: Silicon oxide film with a film thickness of 543 nm
   (The film thickness is a thickness from the upper surface of the piezoelectric substrate 80.)
  Pitch λ, of the IDT 84: 1.7809 μm
  Number of pairs of the IDT 84: 50 pairs to 200 pairs
  Aperture length of the IDT 84: 15λ, to 35λ,
   (The combination of the number of pairs and the aperture length differs among the resonators S5 through S7)

Under the above-described condition, the pass characteristics of the transmit filter 10 and the receive filter at 25° C. were simulated.

Figure 7:
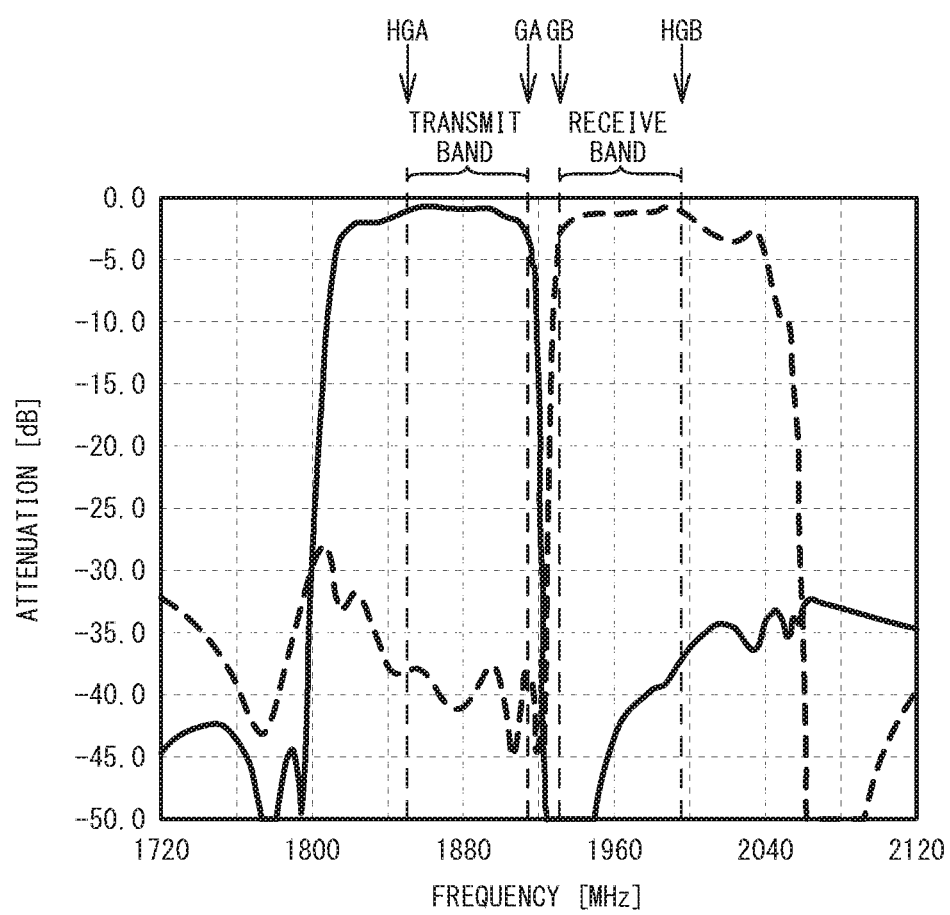
FIG. 7 illustrates pass characteristics at room temperature in the first embodiment.

FIG. 7 illustrates pass characteristics at room temperature in the first embodiment. The solid line indicates the pass characteristic of the transmit filter 10, and the dashed line indicates the pass characteristic of the receive filter 12. As illustrated in FIG. 7, the transmit band and the receive band do not overlap. In the LTE band 25, the guard band between the transmit band and the receive band is narrow. The characteristics of the parallel resonators P1 through P3 mainly affect the lower-frequency side skirt characteristic of the transmit band. The characteristics of the series resonators S1 through S4 mainly affect the higher-frequency side skirt characteristic of the transmit band. The characteristics of the parallel resonators P4 through P6 mainly affect the lower-frequency side skirt characteristic of the receive band. The characteristics of the series resonators S5 through S8 mainly affect the higher-frequency side skirt characteristic of the receive band.

Figure 8A:
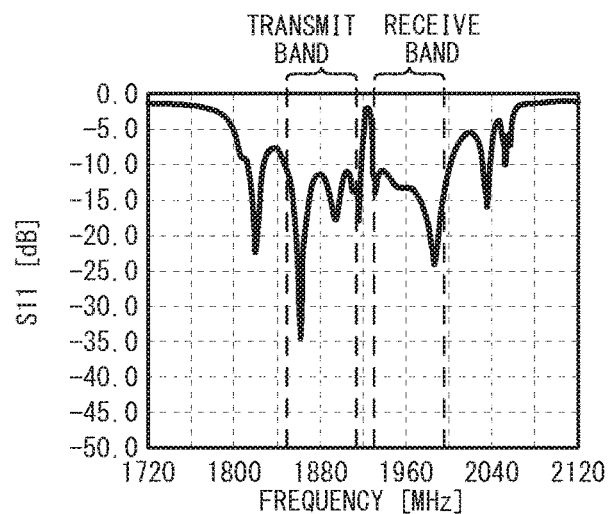
FIG. 8A through FIG. 8C illustrate reflection characteristics as viewed from a common terminal, a transmit terminal, and a receive terminal, respectively.
Figure 8B:
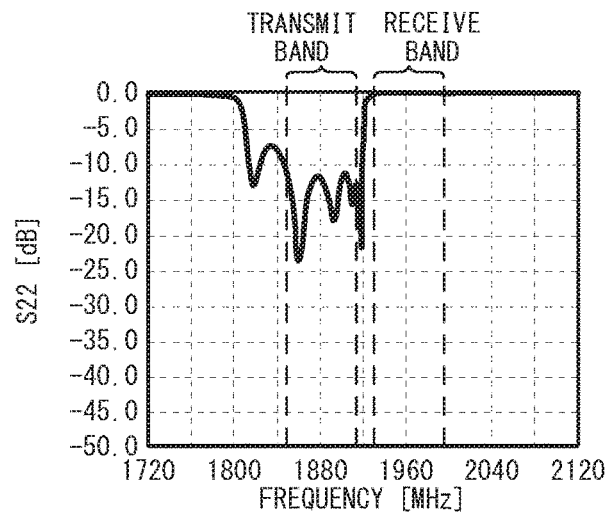
Figure 8C:
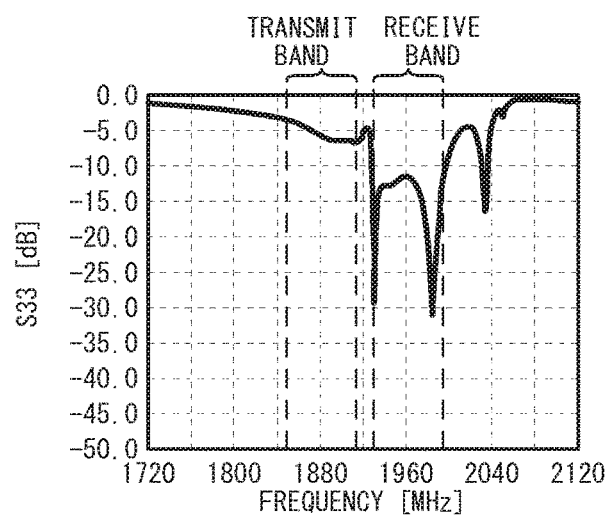

FIG. 8A through FIG. 8C illustrate reflection characteristics as viewed from the common terminal, the transmit terminal, and the receive terminal, respectively. That is, when the common terminal Ant, the transmit terminal Tx, and the receive terminal Rx respectively correspond to ports 1, 2, and 3, FIG. 8A through FIG. 8C illustrate the magnitudes of S11, S22, and S33, respectively. Since the transmit filter 10 allows signals in the transmit band to pass therethrough, smaller S11 and smaller S22 are preferable in the transmit band. Since the receive filter 12 allows signals in the receive band to pass therethrough, smaller S11 and smaller S33 are preferable in the receive band. When S11, S22, and S33 in the passband increase, the loss in the passband increases.

As illustrated in FIG. 8A, for the reflection characteristics as viewed from the common terminal Ant to the transmit filter 10 and the receive filter 12, S11 is −10 dB or less both in the transmit band and the receive band. As illustrated in FIG. 8B, for the reflection characteristics as viewed from the transmit terminal Tx to the transmit filter 10, S22 of the transmit band is −10 dB or less. As illustrated in FIG. 8C, for the reflection characteristics as viewed from the receive terminal Rx to the receive filter 12, S33 of the receive band is −10 dB or less.

When the guard band is narrow as illustrated in FIG. 7, steep guard-band side skirt characteristics are preferable in the transmit filter 10 and the receive filter 12. In addition, the good guard-band side temperature stability of the filter is preferable. The skirt characteristics can be made to be steeper by making the electromechanical coupling coefficient small, and the temperature stability can be improved by making the absolute value of the temperature coefficient of frequency TCF small. Therefore, the series resonators S1 through S4 and the parallel resonators P4 through P6, which affect guard band-side skirt characteristics, are preferably configured to have small electromechanical coupling coefficients and small absolute values of the temperature coefficient of frequency TCF. The piezoelectric thin film resonator illustrated in FIG. 4A through FIG. 5C is preferably used for such resonators. The piezoelectric thin film resonator can make the electromechanical coupling coefficient small, and the skirt characteristic steep. The use of the temperature compensation film 38 can decrease the absolute value of the temperature coefficient of frequency TCF.

On the other hand, the steepness and the temperature stability of the skirt characteristics at the opposite end of the passband from the guard band are not required so much compared to those of the guard-band side skirt characteristics. Instead, the passband of the filter is preferably designed to be as wide as possible. The widening of the bandwidth can be achieved by making the electromechanical coupling coefficient large. The improvement of the electromechanical coupling coefficient has a tradeoff relationship with the steepness of the skirt characteristic. Therefore, the parallel resonators P1 through P3 and the series resonators S5 through S8, which affect the skirt characteristics at the opposite end of the passband from the guard band, are preferably configured to have large electromechanical coupling coefficients. The surface acoustic wave resonator illustrated in FIG. 6A through FIG. 6D is preferably used for such resonators. The surface acoustic wave resonator has a high electromechanical coupling coefficient, and allows for the widening of the passband. Furthermore, as illustrated in FIG. 6C and FIG. 6D, a Rayleigh wave resonator or a Love wave resonator using the temperature compensation film 82 can make the absolute value of the temperature coefficient of frequency TCF small.

When an aluminum nitride film is used as the piezoelectric film 36, the TCF of the piezoelectric thin film resonator is negative without temperature compensation. The TCF can be adjusted with the film thickness of the temperature compensation film 38. However, when the temperature compensation film 38 is thickened, the resonance characteristic deteriorates. Thus, the range of the temperature compensation is limited in the piezoelectric thin film resonator. The temperature characteristic at around the resonant frequency differs from the temperature characteristic at around the antiresonant frequency. For example, in this simulation, the TCF of the resonant frequency is −32 ppm/° C., and the TCF of the antiresonant frequency is −27 ppm/° C. The difference between the TCF of the antiresonant frequency and the TCF of the resonant frequency is approximately 5 ppm/° C. This difference in TCF is approximately 5 ppm/° C. regardless of the materials and the film thicknesses of the temperature compensation film 38 and other layers in the multilayered film 50 when the piezoelectric film 36 is made of aluminum nitride.

When the piezoelectric substrate 80 is a lithium tantalate substrate or a lithium niobate, the TCF of the surface acoustic wave resonator is negative without temperature compensation. The TCF can be adjusted with the film thickness of the temperature compensation film 82. When the temperature compensation film 82 is thickened, the TCF can be made to be approximately 0, but the TCF is normally negative. The TCF of the resonant frequency differs from the TCF of the antiresonant frequency. For example, in this simulation, the TCF of the resonant frequency and the TCF of the antiresonant frequency are both negative. The difference between the TCF of the antiresonant frequency and the TCF of the resonant frequency is approximately 10 ppm/° C. This difference in TCF is approximately 10 ppm/° C. regardless of the film thickness of the silicon oxide film and the material and the film thickness of the metal film 85 when a lithium niobate substrate and a silicon oxide film are respectively used for the piezoelectric substrate 80 and the temperature compensation film 82.

In the filter, the TCFs at the low frequency end and the high frequency end of the passband are important, and these may be considered as the TCF of the resonant frequency of the parallel resonator and the TCF of the antiresonant frequency of the series resonator. Thus, the temperature coefficients of the antiresonant frequencies of the series resonators S1 through S4 are represented by GA, the temperature coefficients of the resonant frequencies of the parallel resonators P1 through P3 are represented by HGA, the temperature coefficients of the antiresonant frequencies of the series resonators S5 through S8 are represented by HGB, and the temperature coefficients of the resonant frequencies of the parallel resonators P4 through P6 are represented by GB.

When a plurality of resonators are considered, each of GA, GB, HGA, and HGB represents the average value of the temperature coefficients of the corresponding resonators. For example, GA is the average value of the temperature coefficients of the antiresonant frequencies of the series resonators S1 through S4. When the difference between the lowest value and the highest value of the antiresonant frequencies of the series resonators S1 through S4 is sufficiently small relative to the passband, the temperature coefficients of the antiresonant frequencies of the series resonators S1 through S4 can be considered practically identical. The same applies to GB, HGA, and HGB.

In a ladder-type filter, when the frequency interval between the antiresonant frequency of the series resonator and the resonant frequency of the parallel resonator changes, the impedance characteristic changes. As in the first embodiment, when the element technologies for the parallel resonator and the series resonator constituting a ladder-type filter differ, the change in impedance characteristic due to the temperature change becomes complicating. At room temperature (25° C.), even when the impedance of the filter is matched, the impedance changes when the temperature increases. This results in the change in the reflection characteristic.

For the transmit filter 10, simulated were reflection characteristics S11 and S22. The TCFs of the antiresonant frequencies of the series resonators S1 through S4, which are piezoelectric thin film resonators, were set to −32 ppm/° C. The TCFs of the resonant frequencies of the parallel resonators P1 through P3, which are surface acoustic wave resonators, were varied from −32 ppm/° C. to −48 ppm/° C.

Figure 9:
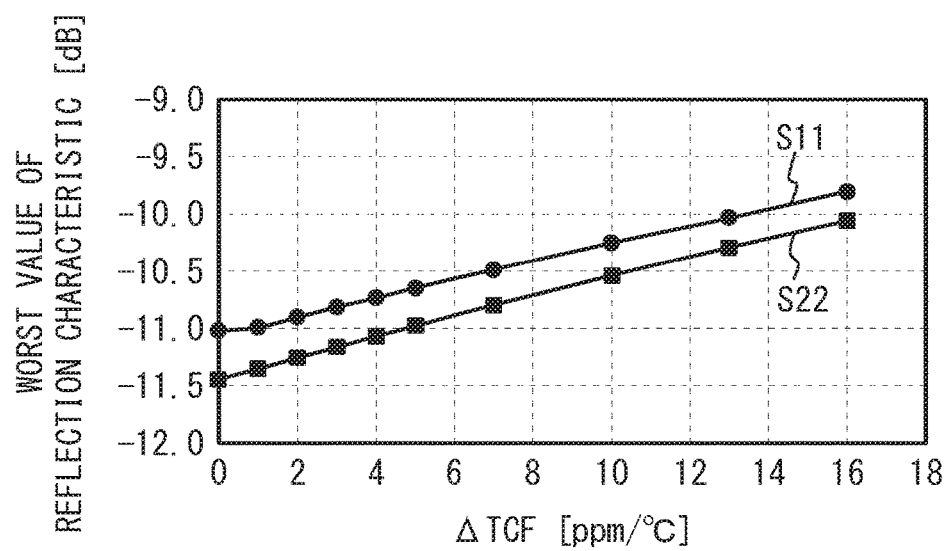
FIG. 9 is a graph of the worst value of the reflection characteristic versus ΔTCF.

FIG. 9 is a graph of the worst value of the reflection characteristic versus ΔTCF. ΔTCF in the horizontal axis is an absolute value calculated by subtracting the TCFs of the resonant frequencies of the parallel resonators P1 through P3 from the TCFs of the antiresonant frequencies of the series resonators S1 through S4. The worst value of the reflection characteristic of the vertical axis is the largest value of S11 or S22 in the transmit band. The impedance characteristic of the transmit filter 10 was optimized at 25° C., and the worst value of the reflection characteristic was simulated at 85° C.

As illustrated in FIG. 9, as ΔTCF in the filter increases, the reflection characteristic at 85° C. deteriorates. The worst value of the reflection characteristic approximately linearly correlates with ΔTCF.

A value calculated by subtracting the TCF of the resonant frequency of one of resonators that are formed with the same element technology and temperature-compensated to similar extent from the TCF of the antiresonant frequency of the other is positive. That is, when the series resonator and the parallel resonator in the same chip are not separately temperature-compensated, GB<GA and HGA<HGB. Thus, reflection characteristics of the filter were simulated for six patterns 1 through 6 with different magnitude relationships among GA, GB, HGA, and HGB.

Figure 10:
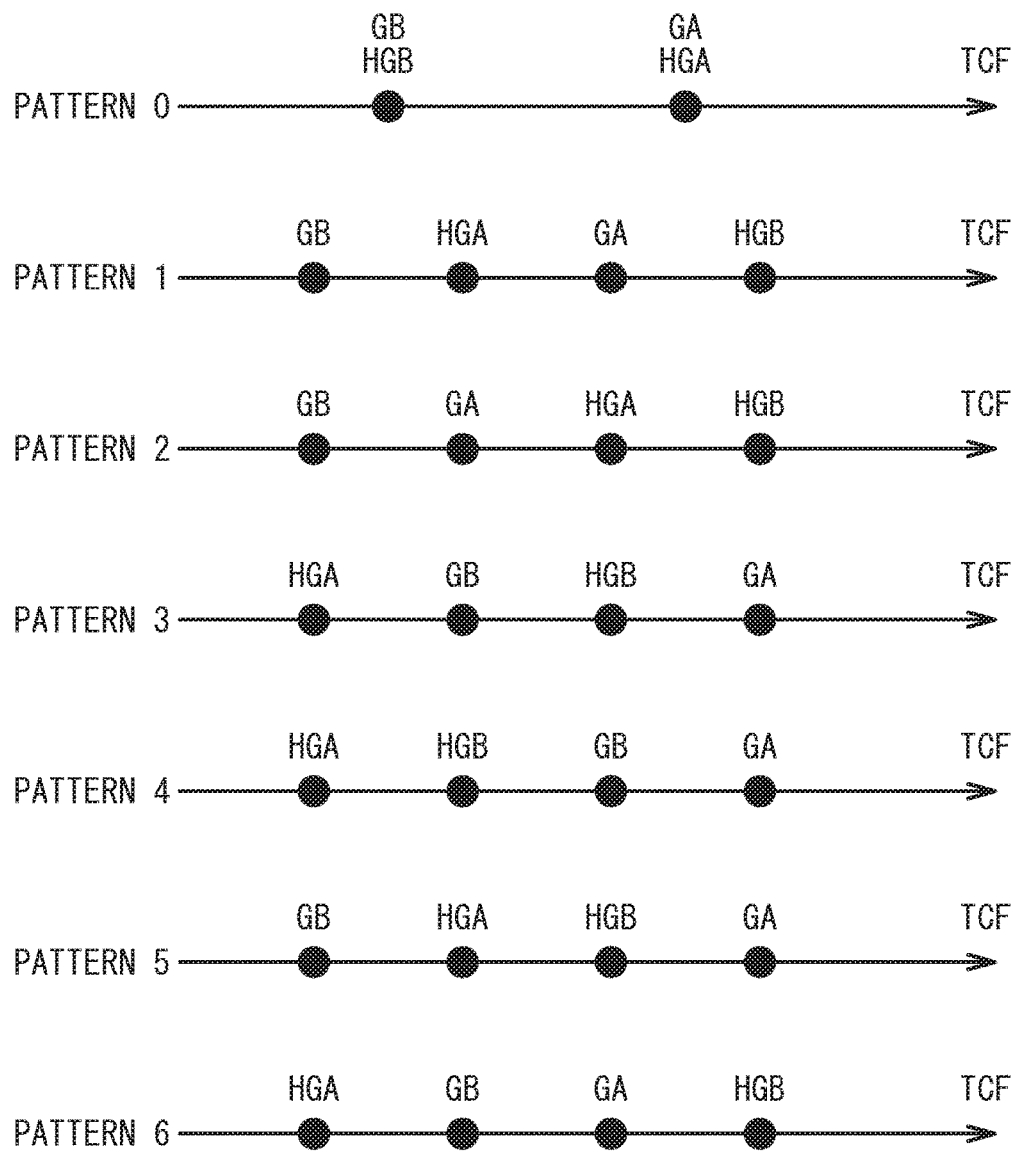
FIG. 10 illustrates magnitude relationships among GA, GB, HGA, and HGB of patterns 0 through 6.

FIG. 10 illustrates magnitude relationships among GA, GB, HGA, and HGB in the pattern 0 through the pattern 6. In FIG. 10, the horizontal axis represents TCF. As illustrated in FIG. 10, in the pattern 1, GB<HGA<GA<HGB. In the pattern 2, GB<GA<HGA<HGB. In the pattern 3, HGA<GB<HGB<GA. In the pattern 4, HGA<HGB<GB<GA. In the pattern 5, GB<HGA<HGB<GA. In the pattern 6, HGA<GB<GA<HGB. As presented, in the patterns 1 through 6, GB<GA and HGA<HGB. Furthermore, in the pattern 0, GB=HGB<GA=HGA.

As the pattern 0 through the pattern 6, the film thicknesses of the temperature compensation films 82 of the surface acoustic wave resonators in the parallel resonators P1 through P3 and the series resonators S5 through S8 were varied to simulate the reflection characteristics.

FIG. 11A lists HGA, GA, GB, and HGB of each pattern, and FIG. 11B lists the film thickness of the temperature compensation film of the surface acoustic wave resonator of each pattern. The film thickness of the temperature compensation film 82 is a thickness from the upper surface of the piezoelectric substrate 80. As illustrated in FIG. 11A, GA represents the TCFs of the antiresonant frequencies fa of the series resonators S1 through S4, which are piezoelectric thin film resonators, and is −27 ppm/° C. and constant. GB represents the TCFs of the resonant frequencies fr of the parallel resonators P4 through P6, which are piezoelectric thin film resonator (described as FBARs), and is −32 ppm/° C. and constant. HGA represents the TCFs of the resonant frequencies fr of the parallel resonators P1 through P3, which are surface acoustic wave resonators (described as SAWs), and was set to a desired value by the film thickness of the temperature compensation film 82 in the parallel resonator. HGB represents the TCFs of the antiresonant frequencies fa of the series resonators S5 through S8, which are surface acoustic wave resonators, and was set to a desired value by the film thickness of the temperature compensation film 82 in the series resonator.

As illustrated in FIG. 11B, the patterns 1, 2, 3, 4, and 6 can achieve a desired TCF even when the film thickness of the temperature compensation film 82 was made to be the same among the parallel resonators P1 through P3 and the series resonators S5 through S8, which are surface acoustic wave resonators.

In the pattern 0, HGB<HGA. Accordingly, when the film thicknesses of the temperature compensation films 82 of the parallel resonators P1 through P3 and the series resonators S5 through S8, which are surface acoustic wave resonators, are the same ink equivalent, HGA<HGB. Therefore, unless the film thicknesses of the temperature compensation films 82 of the parallel resonators P1 through P3, which are surface acoustic wave resonators, are made to be greater than those of the series resonators S5 through S8 ink equivalent, HGB<HGA is not achieved.

In the pattern 5, HGB−HGA<GA−GB. Usually, the difference between the TCF of the antiresonant frequency fa and the TCF of the resonant frequency fr of a piezoelectric thin film resonator is less than the difference between the TCF of the antiresonant frequency fa and the TCF of the resonant frequency fr of an acoustic wave resonator. Thus, when the film thickness of the temperature compensation film 82 is the same among the parallel resonators P1 through P3 and the series resonators S5 through S8, which are surface acoustic wave resonators, GA−GB<HGB−HGA. Therefore, unless the film thicknesses of the temperature compensation films 82 of the parallel resonators P1 through P3, which are surface acoustic wave resonators, are made to be greater than those of the series resonators S5 through S8 in λ equivalent, HGB−HGA<GA−GB is not achieved.

FIG. 12A lists the worst values of the reflection characteristics of the transmit filter and the receive filter, and FIG. 12B lists the rates of changes of the reflection characteristics of the transmit filter and the receive filter. S11 and S22 of the transmit filter 10 represent the reflection characteristics at the common terminal Ant side and the transmit terminal Tx side, respectively, and S11 and S33 of the receive filter 12 represent the reflection characteristics at the common terminal Ant side and the receive terminal Rx side, respectively. The worst value in the transmit filter 10 indicates the largest value (i.e., the smallest absolute value) of S11 and S22 in the transmit band at a temperature of 85° C. The worst value in the receive filter 12 indicates the largest value of S11 and S33 in the receive band at temperature of 85° C. The larger worst value (i.e., smaller absolute value) represents larger reflection.

The rate of change in the transmit filter 10 indicates the rates of changes of S11 and S22 from 25° C. to 85° C., which exhibited the largest change in the transmit band when the temperature was varied from 25° C. to 85° C. The rate of change in the receive filter 12 indicates the rates of changes of S11 and S33 from 25° C. to 85° C., which exhibited the largest change in the receive band when the temperature was varied from 25° C. to 85° C. Negatively larger rate of change (larger absolute value) represents larger deterioration of the reflection characteristic at 85° C. compared to that at 25° C.

In FIG. 12A and FIG. 12B, worst S11 through S33 among the patterns are enclosed in ovals. S11 and S22 of the transmit filter 10 in the pattern 4 are worst. S11 of the receive filter 12 in the pattern 2 is worst, and S33 of the receive filter 12 in the pattern 4 is worst. As described above, the patterns 2 and 4 have large reflection at 85° C.

Hereinafter, preferable GA, GB, HGA, and HGB will be examined. As illustrated in FIG. 9, the relationships between ΔTFC, which is the difference between the TCF of the antiresonant frequency of the series resonator and the TCF of the resonant frequency of the parallel resonator, and the worst values S11max and S22max of the reflection characteristics S11 and S22 in a filter can be approximated by straight lines. The straight lines are expressed by the following equations.

$$S11\mathrm{max} = A \times \Delta TCF + B \quad (1)$$

$$S22\mathrm{max} = C \times \Delta TCF + D \quad (2)$$

For example, in FIG. 9, A=0.078, B=11.055, C=0.0871, and D=11.437.

When ΔTCF of the transmit filter 10 having a lower frequency band is represented by ΔTCF1, and ΔTCF of the receive filter 12 having a higher frequency band is represented by ΔTCF2, ΔTCF1 and ΔTCF2 are expressed by the following equations.

$$\Delta TCF1 = |GA - HGA| \quad (3)$$

$$\Delta TCF2 = |HGB - GB| \quad (4)$$

When ΔG=|GB−GA| and ΔHG=|HGB−HGA|, ΔG and ΔHG are the difference between the TCF of the antiresonant frequency and the TCF of the resonant frequency, and relates to the type and the material of the resonator. In the simulation illustrated in FIG. 10 through FIG. 12B, |GA−GB|=ΔG=5 ppm/° C. and |HGB−HGA|=ΔHG=10 ppm/° C.

Since S22 of the transmit filter 10 and S33 of the receive filter 12 correlate with S11, S11max will be considered. S11max of the transmit filter 10 band is represented by Smax1, and S11max of the receive filter 12 band is represented by Smax2. From the equation 1 and the equations 3 and 4, Smax1 and Smax2 are expressed as follows.

$$Smax1 = A1 \times |\Delta TCF1| + B1 \quad (5)$$
$$= A1 \times |GA - HGA| + B1$$

$$Smax2 = A2 \times |\Delta TCF2| + B2 \quad (6)$$
$$= A2 \times |GB - HGB| + B2$$
$$= A2 \times |(GA + \Delta G) - (HGA + \Delta HG)| + B2$$
$$= A2 \times |GA - HGA - (\Delta HG - \Delta G)| + B2$$

Since A1 and A2 are positive, based on the equations 5 and 6, Smax1 and Smax2 become minimum when |GA−HGA| and |GA−HGA−(ΔHG−ΔG)| are minimum. If all the temperature characteristics are not considered, ΔG=ΔHG=0, but if considered, ΔG and ΔHG do not become the same because the chips 60 and 62 use different types of resonators and different materials. Thus, Smax1 and Smax2 cannot be made to be simultaneously minimum. That is, when Smax1 is made to be minimum, Smax2 becomes large, and when Smax2 is made to be minimum, Smax1 becomes large.

When the range within which both Smax1 and Smax2 can be made to be small is represented by ΔTCFmin,
In a case of GA−HGA<0, $$|GA-HGA|<\Delta TCFmin<|GA-HGA-(\Delta HG-\Delta G)| \quad (7)$$

In a case of GA−HGA>0, $$|GA-HGA-(\Delta HG-\Delta G)|<\Delta TCFmin<|GA-HGA| \quad (8)$$

According to the equations 7 and 8, to make both Smax1 and Smax2 small, |GA−HGA−(ΔHG−ΔG)| is preferably reduced in a case of GA−HGA<0. In a case of GA−HGA>0, |GA−HGA| is preferably reduced.

Figure 13A:
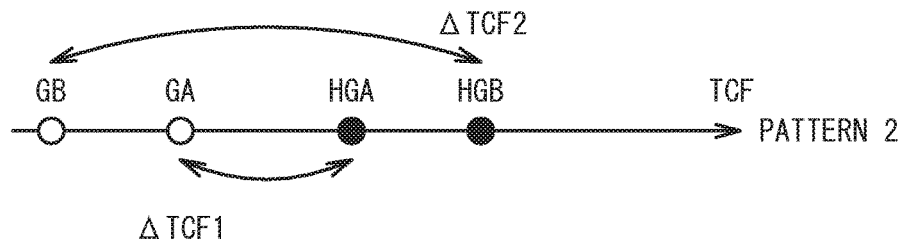
FIG. 13A through FIG. 13E illustrate magnitude relationships among GA, GB, HGA, and HGB.
Figure 13B:
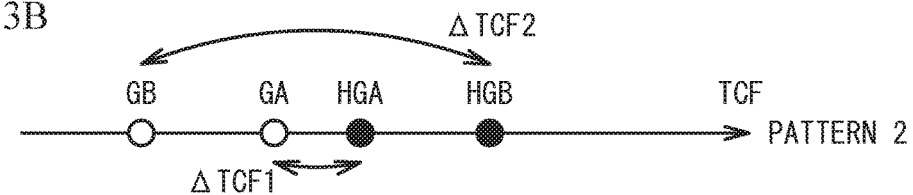
Figure 13C:
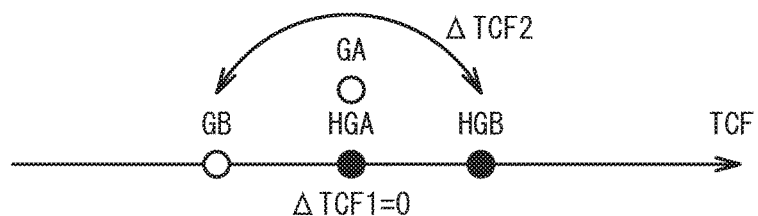
Figure 13D:
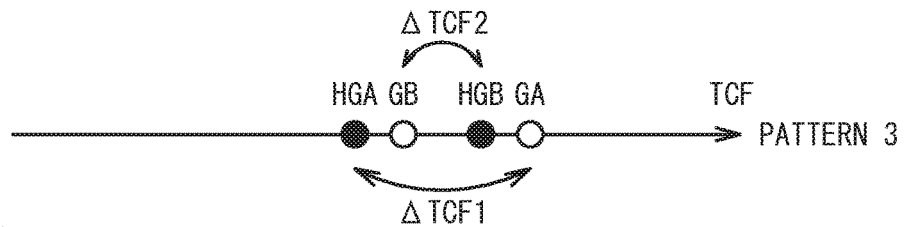
Figure 13E:
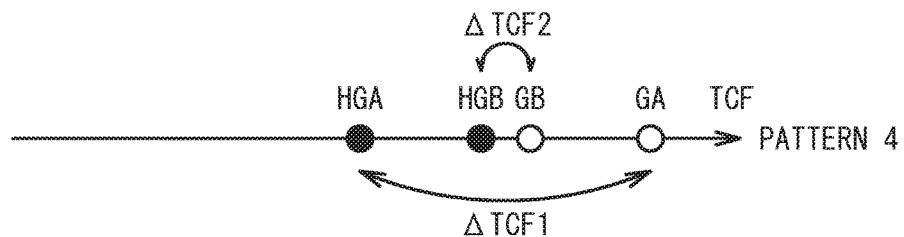

FIG. 13A through FIG. 13E illustrate the magnitude relationships among GA, GB, HGA, and HGB. FIG. 13A illustrates the magnitude relationship of the pattern 2. Since ΔG=|GB−GA| and ΔHG=|HGB−HGA| remain unchanged even when the temperature compensation is performed, ΔG=|GB−GA| and ΔHG=|HGB−HGA| are constant. In the pattern 2, ΔTCF2 is greater than ΔTCF1. Thus, as illustrated in FIG. 13B, TCFs of GA and GB are increased. At this time, ΔG remains unchanged. ΔTCF1 and ΔTCF2 becomes less than those in FIG. 13A. As illustrated in FIG. 13C, GA and GB are further increased. When GA becomes equal to GHA, ΔTCF1 becomes zero. However, ΔTCF2 is still large. Thus, as illustrated in FIG. 13D, GA and GB are further increased. The magnitude relationship among GA, GB, HGA, and HGB becomes the pattern 3. ΔTCF2 decreases, but ΔTCF1 increases. As illustrated in FIG. 13E, when GA and GB are further increased, the magnitude relationship among GA, GB, HGA, and HGB becomes the pattern 4. At this time, ΔTCF2 is small, but ΔTCF1 is large. As described above, in the pattern 2 and the pattern 4, ΔTCF1 or ΔTCF2 becomes large.

More generalized, in the magnitude relationship in which GB and HGB are located between GA and HGA and in the magnitude relationship in which GA and GBA are located between GB and HGB, one of ΔTCF1 and ΔTCF2 becomes large. That is, one of Smax1 and Smax2 becomes large.

As described above, in the first embodiment, as illustrated in FIG. 2, the chip 60 (a first chip) includes the series resonators S1 through S4 (first series resonators) of the transmit filter 10 and the parallel resonators P4 through P6 (second parallel resonators) of the receive filter 12. The chip 62 (a second chip) different from the chip 60 includes the parallel resonators P1 through P3 (first parallel resonators) of the transmit filter 10 and series resonators S5 through S8 (second series resonators) of the receive filter 12. In addition, the magnitude relationship of them are none of the relationship in which GA differs from HGA, and GB and HGB are located between GA and HGA and the relationship in which GB differs from HGB, and GA and HGA are located between GB and HGB.

When GA differs from HGA, and GB and HGB are located between GA and HGA, |GA−GHA| becomes large. Thus, Smax1 becomes large. When GB differs from HGB, and GA and HGA are located between GB and HGB, |GA−HGA−(ΔHG−ΔG)| becomes large. Thus, Smax2 becomes large. Therefore, the relationship among GA, GB, HGA, and HGB is made to be none of the above-described relationships. This setting prevents one of Smax1 and Smax2 from becoming large, and allows both Smax1 and Smax2 to be small. That is, both the reflection characteristics in the passbands of the transmit filter 10 and the receive filter 12 can be made to be good. Accordingly, the characteristics deterioration due to the temperature change of the duplexer can be reduced.

As illustrated in FIG. 10, when the TCF of the antiresonant frequency is less than the TCF of the resonant frequency, i.e., when GB<GA and HGA<HGB, one of the relationships of the pattern 1 (GB<HGA<GA<HGB), the pattern 3 (HGA<GB<HGB<GA), the pattern 5 (GB<HGA<HGB<GA), and the pattern 6 (HGA<GB<GA<HGB) is preferable. These relationships can make both the reflection characteristics of the transmit filter 10 and the receive filter 12 good. A simulation was conducted on a case where all GA, GB, HGA, and HGB are negative, but Smax1 and Smax2 are approximately proportional to ΔTCF1 and ΔTCF2 as illustrated in FIG. 9. Therefore, even when one or some of or all of GA, GB, HGA, and HGB are positive, the same conclusion is obtained.

All the series resonators S1 through S8 and the parallel resonators P1 through P6 may be piezoelectric thin film resonators, or may be surface acoustic wave resonators. However, the series resonators S1 through S4 (first series resonators) and the parallel resonators P4 through P6 (second parallel resonators) are preferably piezoelectric thin film resonators, and the series resonators S5 through S8 (second series resonators) and the parallel resonators P1 through P3 (first parallel resonators) are preferably surface acoustic wave resonator. This structure can make the guard-band side skirt characteristic steep, and widen the bands of the transmit filter 10 and the receive filter 12.

At least one of the series resonators S1 through S4 and the parallel resonators P4 through P6, which are piezoelectric thin film resonators, and/or at least one of the series resonators S5 through S8 and the parallel resonators P1 through P3, which are surface acoustic wave resonators, is preferably temperature-compensated. This structure allows for the adjustment of the TCF of the resonator. For example, at least one of the series resonators S1 through S4 and the parallel resonators P4 through P6 may be the piezoelectric thin film resonator having the temperature compensation film 38 illustrated in FIG. 4A through FIG. 4C. At least one of the series resonators S1 through S4 and the parallel resonators P4 through P6 may be the piezoelectric thin film resonator without the temperature compensation film illustrated in FIG. 5A through FIG. 5C. In addition, for example, at least one of the series resonators S5 through S8 and the parallel resonators P1 through P3 may be the surface acoustic wave resonator having the temperature compensation film 82 illustrated in FIG. 6C and FIG. 6D. At least one of the series resonators S5 through S8 and the parallel resonators P1 through P3 may be the surface acoustic wave resonator without a temperature compensation film illustrated in FIG. 4B.

The series resonators S1 through S4 and the parallel resonators P4 through P6 preferably include the temperature compensation films 38 with practically identical film thicknesses, or all of them preferably include no temperature compensation film. This structure can omit the step for making the film thicknesses of the temperature compensation films 38 different in the chip 60. Thus, the fabrication process of the chip 60 illustrated in FIG. 2 can be simplified. The description "the temperature compensation films 38 with practically identical film thicknesses" means that the temperature compensation films 38 have identical film thicknesses to the extent that the difference in film thickness when the films are formed by the same fabrication process is permitted. The same applies to the temperature compensation film 82 described hereinafter.

The series resonators S5 through S8 and the parallel resonators P1 through P3 preferably include the temperature compensation films 82 with practically identical film thicknesses, or all of them preferably include no temperature compensation film. This structure can omit the step for making the film thicknesses of the temperature compensation films 82 different in the chip 62. Thus, the fabrication process of the chip 62 in FIG. 2 can be simplified.

The series resonators S1 through S4 and the parallel resonators P4 through P6 are piezoelectric thin film resonators, and include the temperature compensation films 38 with practically identical film thicknesses. Alternatively, all of them include no temperature compensation film 38. In addition, the series resonators S5 through S8 and the parallel resonators P1 through P3 are surface acoustic wave resonators, and include the temperature compensation films 82 with practically identical film thicknesses, or all of them include no temperature compensation film 82. This structure can simplify the fabrication process of the chips 60 and 62 in FIG. 2. To achieve the pattern 5 (i.e., GB<HGA<HGB<GA), the film thickness of the temperature compensation film 82 of the surface acoustic wave resonator needs to differ between the series resonators S5 through S8 and the parallel resonators P1 through P3. Therefore, the above-described film thickness is not achieved. Thus, the magnitude relationship among GA, GB, HGA, and HGB is preferably any one of the relationships of the pattern 1, the pattern 3, and the pattern 6.

Since the TCF of the antiresonant frequency and the TCF of the parallel resonator differ even in the same chip, GA differs from HGA, and GB differs from HGB. As in the pattern 0 in FIG. 10, GA is made to be practically identical to HGA, and GB is made to be practically identical to HGB. This structure can make both ΔTCF of the transmit filter 10 and ΔTCF of the receive filter 12 small. Thus, the reflection characteristics in the passbands of the transmit filter 10 and the receive filter 12 can be improved.

As illustrated in FIG. 2 and FIG. 3, the substrate 70 includes the chips 60 and 62 mounted thereon. The wiring lines 66a and 66b are located on the substrate 70. The wiring line 66a (a first wiring line) connects the series resonators S1 through S4 and the parallel resonators P1 through P3. The wiring line 66b (a second wiring line) connects the series resonators S5 through S8 and the parallel resonator P4 through P8. This structure allows a series resonator and a parallel resonator located on different chips to form a ladder-type filter. An exemplary case where the chips 60 and 62 are flip-chip mounted on the substrate 70 has been described, but the chips 60 and 62 may be face-up mounted on the substrate 70. An exemplary case where the wiring lines 66a and 66b are located on the uppermost surface of the substrate 70, but the wiring lines 66a and 66b may be located inside the substrate 70.

In the first embodiment, a first filter with a lower passband is the transmit filter 10, and a second filter with a higher passband is the receive filter 12. The first filter may be the receive filter, and the second filter may be the transmit filter. Alternatively, both the first filter and the second filter may be a transmit filter, and both the first filter and the second filter may be a receive filter.

In FIG. 1, the number of and the connection relationship among one or more series resonators and one or more parallel resonators of the transmit filter 10 and the receive filter 12 can be freely selected. In addition, the number of and the connection relationship of inductors may be freely selected.

FIG. 14 lists examples of the LTE band to which the first embodiment can be applied. FIG. 14 presents LTE bands and the transmit band and the receive band of each LTE band. As illustrated in FIG. 14, the first embodiment can be applied to duplexers for LTE band B1 to B5, B7, B8, B12, B13, B17, B20, B22, B25 to B28, and B30. Especially, the first embodiment is preferably applied to the LTE band other than LTE bands B1 and B4 with a narrow guard band.

Although the embodiments of the present invention have been described in detail, it is to be understood that the various change, substitutions, and alterations could be made hereto without departing from the spirit and scope of the invention.

What is claimed is:
1. A duplexer comprising:
   a first filter that is connected between a common terminal and a first terminal, and includes a first series resonator and a first parallel resonator;
   a second filter that has a passband higher than a passband of the first filter, is connected between the common terminal and a second terminal, and includes a second series resonator and a second parallel resonator;
   a first chip on which the first series resonator and the second parallel resonator are located;
   a second chip that differs from the first chip, and on which the first parallel resonator and the second series resonator are located, wherein
   when a temperature coefficient of an antiresonant frequency of the first series resonator is represented by GA, a temperature coefficient of a resonant frequency of the first parallel resonator is represented by HGA, a temperature coefficient of an antiresonant frequency of the second series resonator is represented by HGB, and a temperature coefficient of a resonant frequency of the second parallel resonator is represented by GB, GB and HGB are not located between GA and HGA, and GA and HGA are not located between GB and HGB.

2. The duplexer according to claim 1, further comprising:
   a substrate that includes the first chip and the second chip mounted thereon, a first wiring line connecting the first series resonator and the first parallel resonator, and a second wiring line connecting the second series resonator and the second parallel resonator.

3. A duplexer comprising:
   a first filter that is connected between a common terminal and a first terminal, and includes a first series resonator and a first parallel resonator;
   a second filter that has a passband higher than a passband of the first filter, is connected between the common terminal and a second terminal, and includes a second series resonator and a second parallel resonator;
a first chip on which the first series resonator and the second parallel resonator are located;
a second chip that differs from the first chip, and on which the first parallel resonator and the second series resonator are located, wherein
when a temperature coefficient of an antiresonant frequency of the first series resonator is represented by GA, a temperature coefficient of a resonant frequency of the first parallel resonator is represented by HGA, a temperature coefficient of an antiresonant frequency of the second series resonator is represented by HGB, and a temperature coefficient of a resonant frequency of the second parallel resonator is represented by GB, a magnitude relationship among GA, GB, HGA, and HGB is any one of GB<HGA<GA<HGB, HGA<GB<HGB<GA, GB<HGA<HGB<GA, and HGA<GB<GA<HGB.

4. The duplexer according to claim 3, wherein
the first series resonator and the second parallel resonator are piezoelectric thin film resonators, and
the first parallel resonator and the second series resonator are surface acoustic wave resonators.

5. The duplexer according to claim 4, wherein
the first series resonator and the second parallel resonator include temperature compensation films with practically identical film thicknesses, or all of the first series resonator and the second parallel resonator include no temperature compensation film.

6. The duplexer according to claim 4, wherein
the first parallel resonator and the second series resonator include temperature compensation films with practically identical film thicknesses, or all of the first parallel resonator and the second series resonator include no temperature compensation film.

7. The duplexer according to claim 4, wherein
the first series resonator and the second parallel resonator include temperature compensation films with practically identical film thicknesses, or all of the first series resonator and the second parallel resonator include no temperature compensation film,
the first parallel resonator and the second series resonator include temperature compensation films with practically identical film thicknesses, or all of the first parallel resonator and the second series resonator include no temperature compensation film, and the magnitude relationship among GA, GB, HGA, and HGB is any one of GB<HGA<GA<HGB, HGA<GB<HGB<GA, and HGA<GB<GA<HGB.

8. The duplexer according to claim 4, wherein at least one of the piezoelectric thin film resonators and/or at least one of the surface acoustic wave resonators is temperature-compensated.

9. The duplexer according to claim 3, wherein
all of GA, GB, HGA, and HGB are negative.

10. The duplexer according to claim 3, further comprising:
a substrate that includes the first chip and the second chip mounted thereon, a first wiring line connecting the first series resonator and the first parallel resonator, and a second wiring line connecting the second series resonator and the second parallel resonator.

11. A duplexer comprising:
a first filter that is located between a common terminal and a first terminal, and includes a first series resonator and a first parallel resonator;
a second filter that has a passband higher than a passband of the first filter, is connected between the common terminal and a second terminal, and includes a second series resonator and a second parallel resonator;
a first chip on which the first series resonator and the second parallel resonator are located; and
a second chip that differs from the first chip, and on which the first parallel resonator and the second series resonator are located, wherein
when a temperature coefficient of an antiresonant frequency of the first series resonator is represented by GA, a temperature coefficient of a resonant frequency of the first parallel resonator is represented by HGA, a temperature coefficient of an antiresonant frequency of the second series resonator is represented by HGB, and a temperature coefficient of a resonant frequency of the second parallel resonator is represented by GB, GA is practically identical to HGA, GB is practically identical to HGB, each of GA and HGA differs from each of GB and HGB.

12. The duplexer according to claim 11, further comprising:
a substrate that includes the first chip and the second chip mounted thereon, a first wiring line connecting the first series resonator and the first parallel resonator, and a second wiring line connecting the second series resonator and the second parallel resonator.

* * * * *